United States Patent
Ashrafi et al.

(10) Patent No.: US 10,451,902 B2
(45) Date of Patent: Oct. 22, 2019

(54) SUPPRESSION OF ELECTRON-HOLE RECOMBINATION USING ORBITAL ANGULAR MOMENTUM SEMICONDUCTOR DEVICES

(71) Applicant: NXGEN PARTNERS IP, LLC, Dallas, TX (US)

(72) Inventors: Solyman Ashrafi, Plano, TX (US); Roger Linquist, Dallas, TX (US); Nima Ashrafi, Plano, TX (US)

(73) Assignee: NXGEN PARTNERS IP, LLC, Dallas, TX (US)

( * ) Notice: Subject to any disclaimer, the term of this patent is extended or adjusted under 35 U.S.C. 154(b) by 243 days.

(21) Appl. No.: 14/816,781

(22) Filed: Aug. 3, 2015

(65) Prior Publication Data

US 2016/0041411 A1    Feb. 11, 2016

Related U.S. Application Data

(60) Provisional application No. 62/035,212, filed on Aug. 8, 2014.

(51) Int. Cl.

| | |
|---|---|
| G02F 1/01 | (2006.01) |
| H01L 51/50 | (2006.01) |
| H01L 51/42 | (2006.01) |
| H01L 31/054 | (2014.01) |
| H01L 31/0232 | (2014.01) |
| G03H 1/02 | (2006.01) |
| G03H 1/08 | (2006.01) |

(52) U.S. Cl.
CPC ............... *G02F 1/0121* (2013.01); *G02F 1/01* (2013.01); *G03H 1/02* (2013.01); *G03H 1/024* (2013.01); *G03H 1/08* (2013.01); H01L 31/02325 (2013.01); *H01L 31/054* (2014.12); H01L 51/42 (2013.01); *H01L 51/50* (2013.01); G03H 2001/0212 (2013.01); G03H 2222/35 (2013.01)

(58) Field of Classification Search
CPC ............ G02F 1/01–0126; G03H 1/024; H01L 31/054; H01L 31/02325; H01L 51/50; H01L 51/42
See application file for complete search history.

(56) References Cited

U.S. PATENT DOCUMENTS

| | | | |
|---|---|---|---|
| 3,459,466 A | 8/1969 | Giordmaine | |
| 3,614,722 A | 10/1971 | Jones | |

(Continued)

OTHER PUBLICATIONS

Genevet et al. "Holographic detection of the orbital angular momentum of light with plasmonic photodiodes," Nature Communications, Dec. 11, 2012.*

(Continued)

*Primary Examiner* — Allison Bourke

(57) ABSTRACT

An apparatus for suppressing electron/hole recombination includes a photonic device that generates electron/hole pairs responsive to a light beam interacting with the photonic device. An orbital angular momentum (OAM) generation device is located to impart an orbital angular momentum to a light beam before the light beam interacts with the photonic device. The electron/hole pair recombination generated from an OAM imparted light beam is less than electron/hole pair recombination of a non-OAM imparted light beam.

26 Claims, 4 Drawing Sheets

(56) References Cited

U.S. PATENT DOCUMENTS

| | | | |
|---|---|---|---|
| 3,978,333 A * | 8/1976 | Crisman | H01L 31/022425 |
| | | | 136/255 |
| 4,379,409 A | 8/1983 | Primbsch et al. | |
| 4,503,336 A | 3/1985 | Hutchin et al. | |
| 4,736,463 A | 4/1988 | Chavez | |
| 4,862,115 A | 8/1989 | Lee et al. | |
| 5,051,754 A | 9/1991 | Newberg | |
| 5,220,163 A | 6/1993 | Toughlian et al. | |
| 5,222,071 A | 6/1993 | Pezeshki et al. | |
| 5,272,484 A | 12/1993 | Labaar | |
| 5,543,805 A | 8/1996 | Thaniyavarn | |
| 5,555,530 A | 9/1996 | Meehan | |
| 6,337,659 B1 | 1/2002 | Kim | |
| 6,992,829 B1 | 1/2006 | Jennings et al. | |
| 7,577,165 B1 | 8/2009 | Barrett | |
| 7,701,381 B2 | 4/2010 | Schmitt et al. | |
| 7,729,572 B1 | 6/2010 | Pepper et al. | |
| 7,792,431 B2 | 9/2010 | Jennings et al. | |
| 8,432,884 B1 | 4/2013 | Ashrafi | |
| 8,503,546 B1 | 8/2013 | Ashrafi | |
| 8,559,823 B2 | 10/2013 | Izadpanah et al. | |
| 8,811,366 B2 | 8/2014 | Ashrafi | |
| 9,077,577 B1 | 7/2015 | Ashrafi | |
| 2002/0179899 A1 | 12/2002 | Nakayama et al. | |
| 2003/0218143 A1 | 11/2003 | Shields et al. | |
| 2005/0254826 A1 | 11/2005 | Jennings et al. | |
| 2005/0259914 A1 | 11/2005 | Padgett et al. | |
| 2006/0039294 A1 | 2/2006 | Sturrock et al. | |
| 2006/0186432 A1 | 8/2006 | Osipov et al. | |
| 2007/0251543 A1 * | 11/2007 | Singh | G03F 7/70925 |
| | | | 134/1 |
| 2010/0013696 A1 | 1/2010 | Schmitt et al. | |
| 2012/0153305 A1 | 6/2012 | Choong et al. | |
| 2012/0207470 A1 | 8/2012 | Djordevic et al. | |
| 2013/0027774 A1 | 1/2013 | Bovino et al. | |
| 2013/0235744 A1 | 9/2013 | Chen et al. | |
| 2014/0355624 A1 | 12/2014 | Li et al. | |
| 2015/0098697 A1 | 4/2015 | Marom et al. | |

OTHER PUBLICATIONS

Solyman Ashrafi, Spurious Resonances and Modelling of Composite Resonators, 37th Annual Symposium on Frequency Control, 1983.

Solyman Ashrafi, Splitting and contrary motion of coherent bremsstrahlung peaks in strained-layer superlattices, Journal of Applied Physics 70:4190-4193, Dec. 1990.

Solyman Ashrafi, Evidence of Chaotic Pattern in Solar Flux Through a Reproducible Sequence of Period-Doubling-Type Bifurcations, Proceedings of Flight Mechanics/Estimation Theory Symposium, National Aeronautics and Space Administration, May 1991.

Solyman Ashrafi, Combining Schatten's Solar Activity Prediction Model with a Chaotic Prediction Model, National Aeronautics and Space Administration, Nov. 1991.

Solyman Ashrafi, Nonlinear Techniques for Forecasting Solar Activity Directly From its Time Series, Proceedings of Flight Mechanics/ Estimation Theory Symposium, National Aeronautics and Space Administration, May 1992.

Solyman Ashrafi, Detecting and Disentangling Nonlinear Structure from Solar Flux Time Series, 43rd Congress of the International Astronautical Federation, Aug. 1992.

Solyman Ashrafi, Physical Phaseplate for the Generation of a Millimeter-Wave Hermite-Gaussian Beam, IEEE Antennas and Wireless Propagation Letters, RWS 2016; pp. 234-237.

Solyman Ashrafi; Future Mission Studies: Preliminary Comparisons of Solar Flux Models; NASA Goddard Space Flight Center Flight Dynamics Division; Flight Dynamics Division Code 550; Greenbelt, Maryland; Dec. 1991.

PCT: International Search Report and Written Opinion of PCT/ US2015/43714 (related application), dated Nov. 2, 2015, 11 pgs.

Solyman Ashrafi, Channeling Radiation of Electrons in Crystal Lattices, Essays on Classical and Quantum Dynamics, Gordon and Breach Science Publishers, 1991.

Solyman Ashrafi, Solar Flux Forecasting Using Mutual Information with an Optimal Delay, Advances in the Astronautical Sciences, American Astronautical Society, vol. 84 Part II, 1993.

Solyman Ashrafi, PCS system design issues in the presence of microwave OFS, Electromagnetic Wave Interactions, Series on Stability, Vibration and Control of Systems, World Scientific, Jan. 1996.

Solyman Ashrafi, Performance Metrics and Design Parameters for an FSO Communications Link Based on Multiplexing of Multiple Orbital-Angular-Momentum Beams, Globecom2014 OWC Workshop, 2014.

Solyman Ashrafi, Optical Communications Using Orbital Angular Momentum Beams, Adv. Opt. Photon. 7, 66-106, Advances in Optics and Photonic, 2015.

Solyman Ashrafi, Performance Enhancement of an Orbital-Angular-Momentum-Based Free-Space Optical Communication Link through Beam Divergence Controlling, OSA Technical Digest (online), paper M2F.6. The Optical Society, 2015.

Solyman Ashrafi, Experimental demonstration of enhanced spectral efficiency of 1.18 symbols/s/Hz using multiple-layer-overlay modulation for QPSK over a 14-km fiber link. OSA Technical Digest (online), paper JTh2A.63. The Optical Society, 2014.

Solyman Ashrafi, Link Analysis of Using Hermite-Gaussian Modes for Transmitting Multiple Channels in a Free-Space Optical Communication System, The Optical Society, vol. 2, No. 4, Apr. 2015.

Solyman Ashrafi, Performance Metrics and Design Considerations for a Free-Space Optical Orbital-Angular-Momentum-Multiplexed Communication Link, The Optical Society, vol. 2, No. 4, Apr. 2015.

Solyman Ashrafi, Demonstration of Distance Emulation for an Orbital-Angular-Momentum Beam. OSA Technical Digest (online), paper STh1F.6. The Optical Society, 2015.

Solyman Ashrafi, Free-Space Optical Communications Using Orbital-Angular-Momentum Multiplexing Combined with MIMO-Based Spatial Multiplexing. Optics Letters, vol. 40, No. 18, Sep. 4, 2015.

Solyman Ashrafi, Enhanced Spectral Efficiency of 2.36 bits/s/Hz Using Multiple Layer Overlay Modulation for QPSK over a 14-km Single Mode Fiber Link. OSA Technical Digest (online), paper SW1M.6. The Optical Society, 2015.

Solyman Ashrafi, Experimental Demonstration of a 400-Gbit/s Free Space Optical Link Using Multiple Orbital-Angular-Momentum Beams with Higher Order Radial Indices. OSA Technical Digest (online), paper SW4M.5. The Optical Society, 2015.

Solyman Ashrafi, Experimental Demonstration of 16-Gbit/s Millimeter-Wave Communications Link using Thin Metamaterial Plates to Generate Data-Carrying Orbital-Angular-Momentum Beams, ICC 2015, London, UK, 2014.

Solyman Ashrafi, Experimental Demonstration of Using Multi-Layer-Overlay Technique for Increasing Spectral Efficiency to 1.18 bits/s/Hz in a 3 Gbit/s Signal over 4-km Multimode Fiber. OSA Technical Digest (online), paper JTh2A.63. The Optical Society, 2015.

Solyman Ashrafi, Experimental Measurements of Multipath-Induced Intra- and Inter-Channel Crosstalk Effects in a Millimeter-Wave Communications Link using Orbital-Angular-Momentum Multiplexing, ICC 2015, London, UK, 2014.

Solyman Ashrafi, Performance Metrics for a Free-Space Communication Link Based on Multiplexing of Multiple Orbital Angular Momentum Beams with Higher Order Radial Indice. OSA Technical Digest (online), paper JTh2A.62. The Optical Society, 2015.

Solyman Ashrafi, 400-Gbit/s Free-Space Optical Communications Link Over 120-meter Using Multiplexing of 4 Collocated Orbital-Angular-Momentum Beams. OSA Technical Digest (online), paper M2F.1. The Optical Society, 2015.

Solyman Ashrafi, Experimental Demonstration of Two-Mode 16-Gbit/s Free-Space mm-Wave Communications Link Using Thin Metamaterial Plates to Generate Orbital Angular Momentum Beams, Optica, vol. 1, No. 6, Dec. 2014.

Solyman Ashrafi, Demonstration of an Obstruction-Tolerant Millimeter-Wave Free-Space Communications Link of Two 1-Gbaud 16-QAM Channels using Bessel Beams Containing Orbital Angular Momen-

(56) References Cited

OTHER PUBLICATIONS tum, Third International Conference on Optical Angular Momentum (ICOAM), Aug. 4-7, 2015, New York USA.

Wang et al: "Terabit free-space data transmission employing orbital angular momentum multiplexing", Nature Photonics, vol. 6, Jul. 2012, pp. 488-496.

Solyman Ashrafi, An Information Theoretic Framework to Increase Spectral Efficiency, IEEE Transactions on Information Theory, vol. XX, No. Y, Oct. 2014, Dallas, Texas.

H. Yao et al, Patch Antenna Array for the Generation of Millimeter-wave Hermite-Gaussian Beams, IEEE Antennas and Wireless Propagation Letters, (pending publication).

Yongxiong Ren et al, Experimental Investigation of Data Transmission Over a Graded-index Multimode Fiber Using the Basis of Orbital Angular Momentum Modes (pending publication).

M. Nouri et al., Perturbations of Laguerre-Gaussian Beams by Chiral Molecules (pending publication).

Solyman Ashrafi, Acoustically induced stresses in elastic cylinders and their visualization, The Journal of the Acoustical Society of America 82(4):1378-1385, Sep. 1987.

Solyman Ashrafi, Splitting of channeling-radiation peaks in strained-layer superlattices, Journal of the Optical Society of America B 8(12), Nov. 1991.

Ren, Y. et al.; Experimental Demonstration of 16 Gbit/s millimeter-wave Communications using MIMO Processing of 2 OAM Modes on Each of Two Transmitter/Receiver Antenna Apertures. In Proc. IEEE GLobal TElecom. Conf. 3821-3826 (2014).

Li, X. et al.; Investigation of interference in multiple-input multiple-output wireless transmission at W band for an optical wireless integration system. Optics Letters 38, 742-744 (2013).

Padgett, Miles J. et al., Divergence of an orbital-angular-momentum-carrying beam upon propagation. New Journal of Physics 17, 023011 (2015).

Mahmouli, F.E. & Walker, D. 4-Gbps Uncompressed Video Transmission over a 60-GHz Orbital Angular Momentum Wireless Channel. IEEE Wireless Communications Letters, vol. 2, No. 2, 223-226 (Apr. 2013).

Vasnetsov, M. V., Pasko, V.A. & Soskin, M.S.; Analysis of orbital angular momentum of a misaligned optical beam; New Journal of Physics 7, 46 (2005).

Byun, S.H., Haji, G.A. & Young, L.E.; Development and application of GPS signal multipath simulator; Radio Science, vol. 37, No. 6, 1098 (2002).

Tamburini, Fabrizio; Encoding many channels on the same frequency through radio vorticity: first experimental test; New Journal of Physics 14, 033001 (2012).

Gibson, G. et al., Free-space information transfer using light beans carrying orbital angular momentum; Optical Express 12, 5448-5456 (2004).

Yan, Y. et al.; High-capacity millimetre-wave communications with orbital angular momentum multiplexing; Nature Communications; 5, 4876 (2014).

Hur, Sooyoung et at.; Millimeter Wave Beamforming for Wireless Backhaul and Access in Small Cell Networks. IEEE Transactions on Communications, vol. 61, 4391-4402 (2013).

Allen, L., Beijersbergen, M., Spreeuw, R.J.C., and Woerdman, J.P.; Orbital Angular Momentum of Light and the Transformation of Laguerre-Gaussian Laser Modes; Physical Review A, vol. 45, No. 11; 8185-8189 (1992).

Anderson, Jorgen Bach; Rappaport, Theodore S.; Yoshida, Susumu; Propagation Measurements and Models for Wireless Communications Channels; 33 42-49 (1995).

Iskander, Magdy F.; Propagation Prediction Models for Wireless Communication Systems; IEEE Transactions on Microwave Theory and Techniques, vol. 50., No. 3, 662-673 (2002).

Wang, Jian, et al.; Terabit free-space data transmission employing orbital angular momentum multiplexing. Nature Photonics; 6, 488-496 (2012).

Katayama, Y., et al.; Wireless Data Center Networking with Steered-Beam mmWave Links; IEEE Wireless Communication Network Conference; 2011, 2179-2184 (2011).

Molina-Terriza, G., et al.; Management of the Angular Momentum of Light: Preparation of Photons in Multidimensional Vector States of Angular Momentum; Physical Review Letters; vol. 88, No. 1; 77, 013601/1-4 (2002).

Rapport, T.S.; Millimeter Wave Mobile Communications for 5G Cellular: It Will Work!; IEEE Access, 1, 335-349 (2013).

\* cited by examiner

SUPPRESSION OF ELECTRON-HOLE RECOMBINATION USING ORBITAL ANGULAR MOMENTUM SEMICONDUCTOR DEVICES

CROSS-REFERENCE TO RELATED APPLICATIONS

This application claims benefit of U.S. Provisional App. No. 62/035,212, filed on Aug. 8, 2014, entitled SUPPRESSION OF ELECTRON-HOLE RECOMBINATION USING ORBITAL ANGULAR MOMENTUM FOR NEXT GENERATION ORGANIC-BASED SEMICONDUCTOR DEVICES, which is incorporated by reference herein in its entirety.

TECHNICAL FIELD

The present invention relates to suppression of electron hole recombinations in photonic devices, and more particularly, to the use of orbital angular momentum to inhibit electron hole recombinations in photonic devices.

BACKGROUND

Within photonic devices, light energy is used for exciting electrons to higher energy levels and creating electrical energy or currents responsive to the light energy. The recombination of photo generated electrons and holes is a major source of energy loss within photonic devices. Examples of photonic devices include photovoltaic diodes, biological light harvesting complexes (LHCs), organic light emitting diodes (OLEDs) and organic photovoltaic cells (OPVs). Biological light harvesting complexes prevent recombination via the use of cascade structures which lead to spatial separation of charge carriers. Organic photovoltaic cells use nanoscale morphology to provide a high rate of electron hole encounters which results in the formation of spin triplet excitons. OPVs would have poor quantum efficiencies if every encounter led to recombination, but state-of-the-art OPVs demonstrate better quantum efficiency. This suppression of recombination between electrons and holes has been engineered to the interplay of spin, orbital angular momentum and delocalization of electron excitations in organic semiconductors. Time resolve spectroscopy can be used to study different engineered models having high efficiency polymer-fullerene systems in which the lowest lying molecular triplet exciton ($T_1$) lies below the intermolecular charge transfer state (CT). Encounters of spin-uncorrelated electrons and holes generate CT states with both spin singlet ($^1CT$) and spin triplet ($^3CT$) characters. Triplet exciton formation can be the major loss mechanism in OPVs. The CT energy lies below $T_1$ making relaxation from $^3CT$ to $T_1$ energetically favored. However, the more efficient 1:3 blend no triplet formation is possible at room temperature, but at low temperatures, bi-molecular triplet formation can be observed in this blend. This suggests that there is a thermally activated process that competes with relaxation to $T_1$. This process is disassociation of $^3CT$ back to free charges. However, even when energetically favored, the relaxation of $^3CT$ spin triplet and CT back to $T_1$ can be strongly suppressed via control over wave function delocalization, allowing for the disassociation of $^3CT$ back to free charges (FC). This reduces recombination and enhances device performance. Thus, some manner for increasing the suppression of electron/hole recombination would further improve the efficiencies of these types of photonic devices.

SUMMARY

The present invention, as disclosed and described herein, in one aspect thereof, comprises an apparatus for suppressing electron/hole recombination includes a photonic device that generates electron/hole pairs responsive to a light beam interacting with the photonic device. An orbital angular momentum (OAM) generation device is located to impart an orbital angular momentum to the light beam before the light beam interacts with the photonic device. The electron/hole pair recombination generated from an OAM imparted light beam is less than electron/hole pair recombination of a non-OAM imparted light beam.

BRIEF DESCRIPTION OF THE DRAWINGS

For a more complete understanding, reference is now made to the following description taken in conjunction with the accompanying Drawings in which.

DETAILED DESCRIPTION

Figure 1:
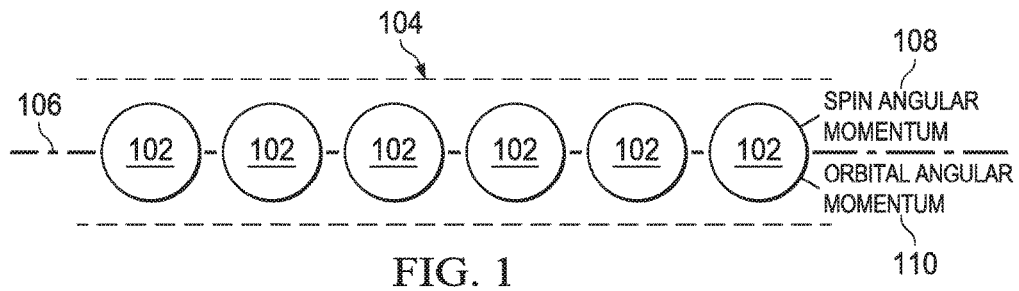
FIG. 1 illustrates a light beam.

Referring now to the drawings, wherein like reference numbers are used herein to designate like elements throughout, the various views and embodiments of s suppression of electron-hole recombination using orbital angular momentum semiconductor devices are illustrated and described, and other possible embodiments are described. The figures are not necessarily drawn to scale, and in some instances the drawings have been exaggerated and/or simplified in places for illustrative purposes only. One of ordinary skill in the art will appreciate the many possible applications and variations based on the following examples of possible embodiments.

Referring now to the drawings, and more particularly to FIG. 1, there is illustrated one embodiment of a beam for use with the system. A light beam 104 consists of a stream of photons 102 within the light beam 104. Each photon has an energy $\pm\hbar\omega$ and a linear momentum of $\pm\hbar k$ which is directed along the light beam axis 106 perpendicular to the wavefront. Independent of the frequency, each photon 102 within the light beam 104 has a spin angular momentum 108 of $\pm\hbar$ aligned parallel or antiparallel to the direction of light beam propagation. Alignment of all of the photons 102 spins gives rise to a circularly polarized light beam. In addition to the circular polarization, the light beams also may be processed to carry an orbital angular momentum 110 which does not depend on the circular polarization and thus is not related to photon spin.

Figure 2:
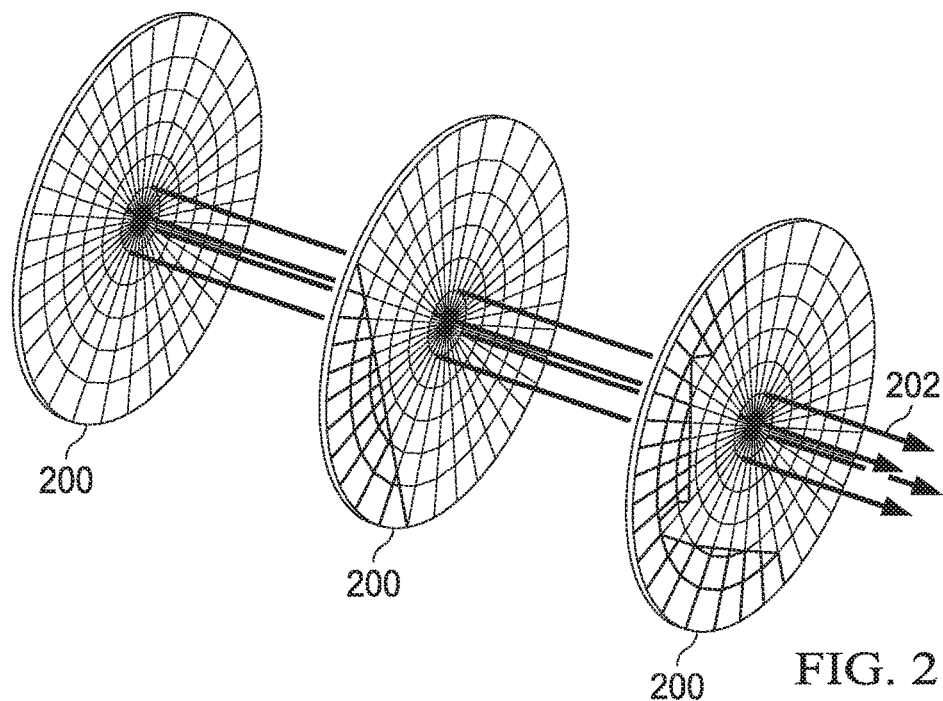
FIG. 2 illustrates a plane wave front.
Figure 3:
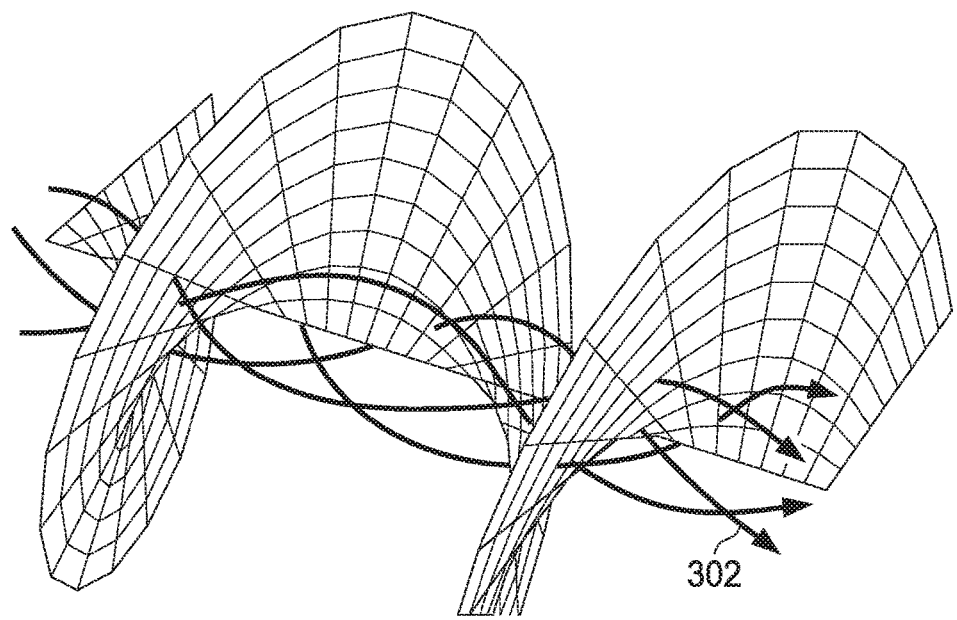
FIG. 3 illustrates a helical wave front.

Referring now to FIGS. 2 and 3, there are illustrated plane wavefronts and helical wavefronts. Ordinarily, laser beams with plane wavefronts 202 are characterized in terms of Hermite-Gaussian modes. These modes have a rectangular symmetry and are described by two mode indices m 204 and n 206. There are m nodes in the x direction and n nodes in the y direction. Together, the combined modes in the x and y direction are labeled $HG_{mn}$ 208. In contrast, as shown in FIG. 3 beams with helical wavefronts 302 are best characterized in terms of Laguerre-Gaussian modes which are described by indices l 303, the number of intertwined helices 304, and p, the number of radial nodes 306. The Laguerre-Gaussian modes are labeled $LG_{mn}$ 610. For l≠0, the phase singularity on a light beam 204 results in 0 on axis intensity. When a light beam 204 with a helical wavefront is also circularly polarized, the angular momentum has orbital and spin components, and the total angular momentum of the light beam is (l±ℏ) per photon.

Figure 4:
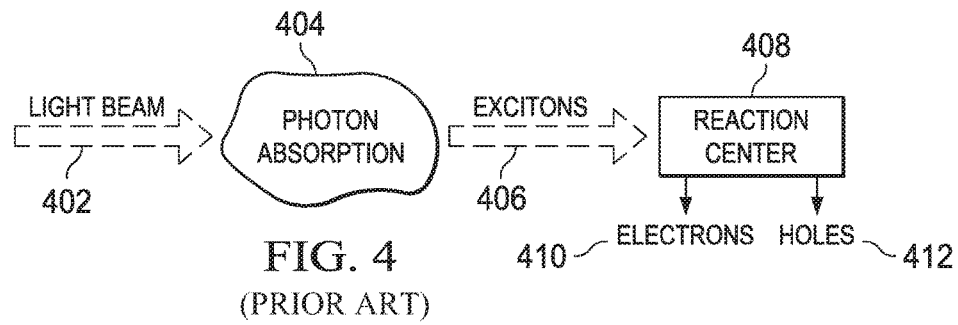
FIG. 4 illustrates the use of light harvesting complexes (LHCs) for generating electron-hole pairs.

Existing techniques for improving electron hole recombination have varied depending upon the particular type of device being utilized. For example as illustrated in FIG. 4, within biological light harvesting complexes (LHCs), a light beam 402 is applied to the LHC such that photonic absorption 404 creates molecular excited states. These molecular excited states comprise excitons 406 that are funneled to reaction centers 408 where they are disassociated into electrons 410 and holes 412. The electrons 410 and holes 412 are separated further via a series of cascading charge transfer steps.

Figure 5:
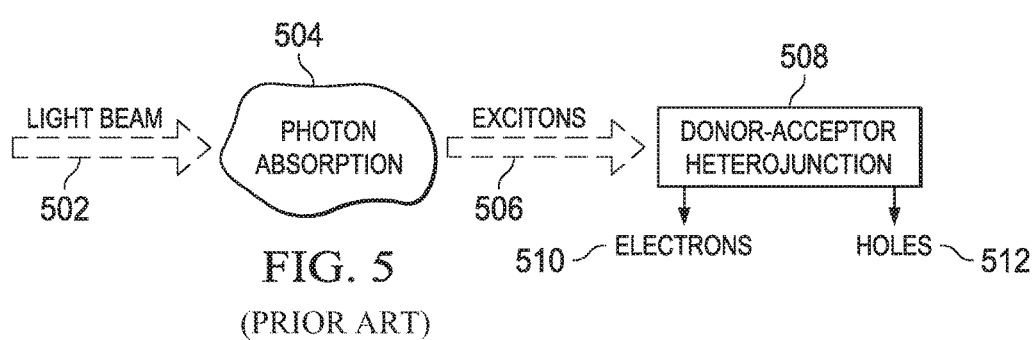
FIG. 5 illustrates the use of organic photovoltaic cells (OPVs) for generating electron-hole pairs.

As illustrated in FIG. 5, organic photovoltaic cells (OPVs) receive a light beam 502 and use photo absorption 504 to create the excitons 506 that are applied to a single donor-acceptor heterojunction 508 formed within a de-mixed blend of a donor and acceptor semiconductor to generate the electrons 510 and holes 512. The most efficient OPV systems comprise nanoscale (less than symbol 5 nm) domains of pure fullerene acceptor and domains of fullerene intimately mixed with a polymer donor. These length scales are smaller than the Coulomb capture radius (CCR) in organic semiconductors ($kT=e^2 4\pi\varepsilon_0\varepsilon r$) which is estimated to be as large as 16 nm at room temperature due to the low dielectric constant of the material (approximately 3-4). Thus, in contrast to LHCs, electrons and holes diffusing through an OPV may encounter one another before they reach the electrodes. This is similar to standard inorganic solar cells, where bimolecular electron-hole recombination (BR) determines solar cell performance.

The rate of electron hole encounters that produce Coulombically bound states is given by $R=\gamma n(p)$, where $n(p)$ is the electron (hole) population density and $\gamma$ is the Langevin recombination constant given by $\gamma=q<\mu>/\varepsilon$, where q equals the electric charge, $<\mu>$ equals the effective electron/hole mobility and $\varepsilon$ equals the dielectric constant. This model successfully describes the principal operating mechanism of OLEDs, where charges injected through the electrodes capture one another to form strongly bound excitons.

Figure 6:
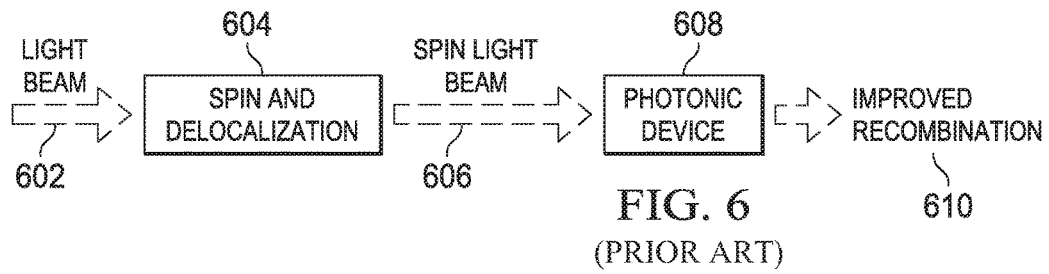
FIG. 6 illustrates the effect of spin and decentralization on electron-hole recombination.

In empirically optimized OPV's, the recombination rate is suppressed by up to three orders of magnitude compared to the Langevin rate, allowing external quantum efficiencies as high as 80 percent. The recombination of bound states formed via electron/hole encounters is mediated not only by energetics, but also by spin and delocalization, allowing for free charges to be reformed from these bound states thus suppressing recombination. This is more particularly illustrated in FIG. 6 which illustrates when a light beam 602 has spin and delocalization characteristics 604 applied thereto, the light beam including spin characteristics 606 may be applied to a photonic device 608. Results have shown that the photonic device 608 will have an improved suppression of the recombination rate due to the spin and delocalization characteristics.

Figure 7:
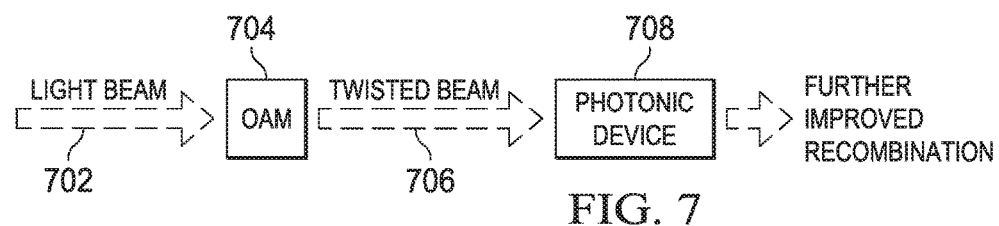
FIG. 7 illustrates the effect of an OAM twisted beam on electron-hole recombination.

Referring now also to FIG. 7, a similar suppression of recombinations between electrons and holes may be achieved using twisted photons that carry orbital angular momentum. The light beam 702 has an orbital angular momentum applied thereto by for example a passive hologram, SLM (spatial light modulator), phase plate, etc. The generated twisted beam 706 may then result in new quantum states which slow down the rate of recombination when applied to a photonic device 708 providing further improved recombination rates.

A new design for an artificial photo-conversion system uses circuitry, such as a phase mask holograms, to apply orbital angular momentum (OAM) to the light signal and enable the suppression of electron hole recombination by avoiding the formation of triplet states in enhancing fluorescence efficiency. By placing OAM circuitry within the path of a photon, the orbital angular momentum generated by the photon can be transferred to an electron and a new quantum state created where suppression of electron-hole recombination is supported. This suppression is due to the change in total angular momentum of the electron (spin+ orbital) using a device that twists the protons with a prescribed topological charge using a variety of methods (passively using a hologram or actively using other methods). The amount of orbital angular momentum applied results in a specific topological charge that can control the rate of recombination. Thus, by controlling the amount of applied OAM, the rate of suppression of recombination may be controlled.

Figure 8:
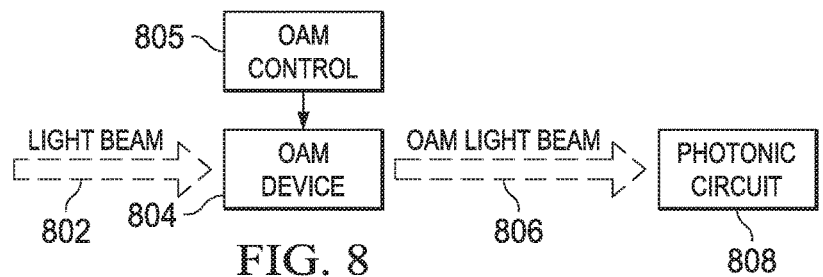
FIG. 8 illustrates a functional block diagram of one manner for improving the suppression of electron-hole recombination in a photonic circuit.

Thus, referring now to FIG. 8, there is illustrated a functional block diagram of one manner for improving the suppression of electron hole recombination in a photonic circuit. A light beam 802 is passed through an OAM device 804 in order to generate an OAM twisted light beam 806. The OAM device 804 may comprise a passive hologram, a spatial light module (SLM), a spatial plate, an amplitude mask, phase mask or any other device capable of applying an orbital angular momentum to the light beam. The amount of OAM twist applied to a light beam may be controlled via an OAM control circuit 805. The OAM control circuit 805 may control the level of OAM twist based upon a desired level of electron-hole recombination within a photonic device. The OAM twisted light beam 806 is applied to some type of photonic circuit 808 that energizes electrons responsive to the OAM light beam 806 to higher states that will decompose into a ground state. The photonic circuit may comprise optical LEDs, organic photovoltaic cells, biological light harvesting complexes, organic semiconductors, PN junctions, semiconductor, solid state devices, solar cells or any other light affected device.

Figure 9:
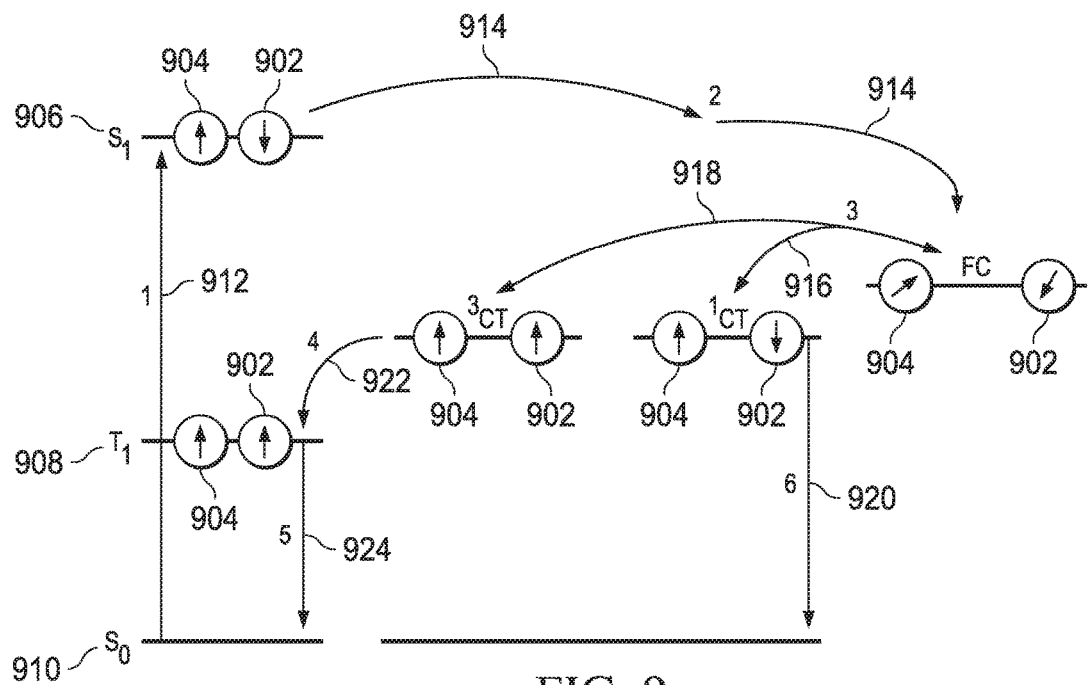
FIG. 9 illustrates the manner in which electrons move between different states within an organic photovoltaic cell.

Referring now to FIG. 9, there is illustrated the manner in which electrons move from different states between various quantum states within an organic photovoltaic cell. Conversions between excited state species are shown at 902 while recombination channels are shown at 904. State $S_1$ 906 and state $T_1$ 908 are the lowest lying singlet excitons 906 and triplet excitons 908, respectively. CT is the charge transfer state. Photoexcitation goes from the ground state $S_0$ 910 to a singlet excitation $S_1$ 906 at 912. The singlet exciton $S_1$ 906 is ionized at a heterojunction leading to the formation of $^1$CT states which separates into free charges (FC) 902, 904 with high efficiency at 914. Biomolecular recombination of electrons and holes leads to the formation of $^1$CT state at 916 and $^3$CT states at 918 in a 1:3 ratio as mandated by spin statistics. The $^1$CT can recombine slowly to the ground state as shown at 920. The $^3$CT state recombination to the ground state $S_0$ 910 is spin forbidden but relaxation of the $T_1$ state 908 at 922 is energetically favorable. Once formed triplet excitons $^3$CT can return to ground state via an efficient triplet charge annihilation channel at 924. Under favorable conditions, the time required for CT states to reorganize to free charges at 918 is less than the time required for relaxation to $T_1$ at 922. Thus, CT states are recycled back to free charges leading to a suppression of recombination.

In order to probe the dynamics of these bound states, we can first consider the initial dissociation of the photo generated singlet exciton, $S_1$ 906 at the D-A interface. The first step of this process is charge transfer across the D-A interface, which can lead to either long-range charge separation or the formation of bound interfacial charge transfer (CT) states. Such bound charge pairs then decay to the ground state $S_0$ 910 via geminate recombination (GR). It is important to note that spin must be taken into account when considering CT states as they can have either singlet ($^1$CT) or triplet ($^3$CT) spin character which are almost degenerate in energy. Disassociation of photo generated singlet excitons leads to the formation of only $^1$CT states 904 due to spin conservation. In contrast, recombination of spin-uncorrelated charges leads to the formation of $^1$CT and $^3$CT states in a 1:3 ratio based on spin statistics. $^1$CT states can either dissociate or recombine to the ground state either via luminescence which is slow for this intermolecular D-A process or non-radioactive decay. For $^3$CT states, decay to ground states is spin forbidden and hence both radiative and non-radiative processes are very slow. However, if the energy of the lowest lying molecular triplet exciton ($T_1$) lies below the $^3$CT energy, then $^3$CT can relax to $T_1$.

The model for recombination in the importance of spin statistics are well-established in OLEDs where the formation of non-luminescent triplet excitons is a major loss mechanism. Efforts to overcome this problem have focused on the use of metal organic complexes to induce spin orbiting coupling and recently on the use of low exchange energy materials that can promote inner system crossing from $T_1$ to $S_1$.

Thin films using transient absorption (TA) spectroscopy have been used in the past. In this technique a pump pulse generates photoexcitations within the film. At some later time, the system is interrogated using a broadband probe pulse. Although TA has been widely employed to study the photophysics of OPV blends previous measurements have been severally limited by three factors. The first limitation has an insufficient temporal range, typically a maximum of 2 ns delay between pump and probe. A second limitation has a limited spectral range and lack of broadband probes, which hinders the observation of dynamic interactions between excitations. And lastly, insufficient sensitivity, which mandates the use of high fluence pump pulses to create large signals.

These issues have been resolved recently using broad temporal (up to 1 ms) and spectral windows (out to 1500 nm) and high sensitivity (better than 5×10−6). This temporal window is created by using an electrically delayed pump-pulse and allows for the study of long-lived charges and triplet excitons. In conjugated polymers local geometrical relaxation around charges (polaron formation) causes rearrangement of energy levels, bringing states into the semiconductor gap and giving rise to strong optical transitions 700 nm-1500 nm. The absorption bands of singlet and triplet excitons are also found to lie in the near IR making a broadband spectral window necessary to track the evolution of the excited state species. The high sensitivity of the experiment is essential as it allows one to probe the dynamics of systems when the excitation densities are similar to solar illumination conditions ($10^{16}$-$10^{17}$ excitations/cm$^3$). At higher excitation densities bimolecular exciton-exciton and exciton-charge annihilation processes can dominate, creating artifacts, making such measurements unreliable indicators of device operation. One can further combine these measurements with advanced numerical techniques that allow one to resolve the spectral signatures of the overlapping excited state features and track their kinetics.

The overlapping spectrum of the excited states makes the analysis of their kinetics difficult. In order to overcome this problem one can use a genetic algorithm (GA), which enables us to extract the individual spectra and kinetics from the data set. Within this approach a linear combination of two or more spectra and associated kinetics can be taken and 'evolved' until they best fit the experimental data.

The extracted kinetics can demonstrate that triplets may grow as charges decay. One can consider that the primary decay channel for triplets is triplet-charge annihilation, due to the high charge densities present, and model the time evolution of the system with the Langevin equation given below:

$$\frac{dN_T}{dt} = -a\frac{dp}{dt} - \beta[N_T][p]$$

where:
p: Charge concentration;
$N_T$: Triplet concentration;
α: is the fraction of decaying charges that form triplets;
β: is the rate constant for triplet-charge annihilation.

We now turn to the question of whether the time taken for relaxation from $^3$CT to $T_1$, process 922 shown in FIG. 9 with an associated timescale $\tau_4$, is fast and if not, whether there are the competing processes for the decay of $^3$CT. As noted earlier the CT energy lies above $T_1$, making relaxation from $^3$CT to $T_1$ energetically favored. However, for the more efficient 1:3 blend, no triplet formation is possible at room temperature. But at low temperatures (<240K), bimolecular triplet formation can be observed in this blend. This suggests that there is a thermally activated process that competes with relaxation to $T_1$. We consider this process to be the dissociation of $^3$CT back to free charges. Thus at high temperatures (>240K) the dissociation of $^3$CT back to free charges, process 918 shown in FIG. 9 with an associated timescale $\tau_3$, out competes relaxation of $^3$CT to $T_1$ i.e. $\tau_4 > \tau_3$. Hence one of the two channels for recombination (the other being recombination through $^1$CT) is suppressed, allowing for high EQEs. At lower temperatures this dissociation process is suppressed, such that $\tau_4 < \tau_3$, leading to a buildup of triplet excitons.

Figure 10:
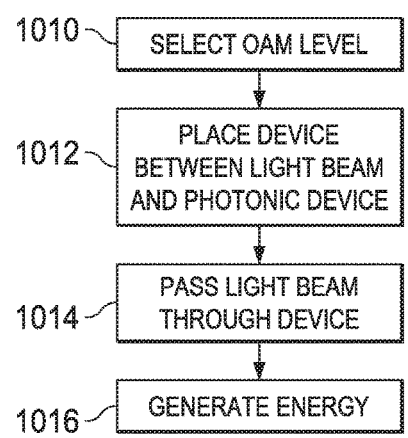
FIG. 10 is a flow diagram illustrating the process for controlling electron-hole recombination using the application of orbital angular momentum to a light beam.

Referring now to FIG. 10, there is illustrated a flow diagram describing one manner for utilizing the application of orbital angular momentum to a light beam to suppress electron-hole conversion within a photonic device. Initially at step 1010, the desired OAM level is selected for application to the light beam. The selected OAM level will provide a desired suppression of the electron-hole recombination rate. The OAM generating device is placed in the path between the light beam and the photonic device at step 1012. The light beam is allowed to pass at step 1014 through the OAM generating device and the OAM twist is applied to the light beam. The OAM twisted light beam then interacts with the photonic device to generate energy at step 1016 such that the electron-hole recombination within the photonic device is affected by the OAM twisted beam.

It will be appreciated by those skilled in the art having the benefit of this disclosure that this suppression of electron-hole recombination using orbital angular momentum semiconductor devices provides an improved manner for suppressing the number of electron-hole recombinations within a photonic device. It should be understood that the drawings and detailed description herein are to be regarded in an illustrative rather than a restrictive manner, and are not intended to be limiting to the particular forms and examples disclosed. On the contrary, included are any further modifications, changes, rearrangements, substitutions, alternatives, design choices, and embodiments apparent to those of ordinary skill in the art, without departing from the spirit and scope hereof, as defined by the following claims. Thus, it is intended that the following claims be interpreted to embrace all such further modifications, changes, rearrangements, substitutions, alternatives, design choices, and embodiments.

What is claimed is:

1. A method for controlling electron/hole recombination within a photonic device having output electrodes, comprising:
    placing an orbital angular momentum (OAM) generating circuit between a light source and the photonic device having output electrodes;
    passing a light beam from the light source through the OAM generating circuit prior to the light beam interacting with the photonic device having output electrodes to generate an OAM imparted light beam;
    controlling a level of OAM applied to the light beam using the OAM generating circuit;
    establishing a first predetermined level of electron/hole recombination suppression desired in the photonic device having output electrodes by applying the light beam having a first OAM level applied thereto from the OAM generating circuit; and
    establishing a second predetermined level of electron/hole recombination suppression desired in the photonic device having output electrodes by applying the light beam having a second OAM level applied thereto from the OAM generating circuit, wherein the second predetermined level of electron/hole recombination suppression is different from the first predetermined level of electron/hole recombination suppression and the second OAM level is different from the first OAM level.

2. The method of claim 1, further comprising generating electron/hole pairs within the photonic device having output electrodes responsive to the OAM imparted light beam, wherein recombination of the electron/hole pairs generated from the OAM imparted light beam is less likely than recombination of electron/hole pairs generated from a non-OAM imparted light beam.

3. The method of claim 1 further comprising the step of generating electrical energy responsive to the OAM imparted light beam interacting within the photonic device having output electrodes, wherein the OAM imparted light beam suppresses electron/hole pair recombination within a electrical energy generation process as compared to electrical energy generated using a non-OAM imparted light beam.

4. The method of claim 1, wherein the OAM generating circuit comprises a hologram.

5. The method of claim 1, wherein the OAM generating circuit comprise a spatial light modulator.

6. The method of claim 1, wherein the OAM generating circuit comprises a spatial plate.

7. An apparatus for controlling electron/hole recombination, comprising:
    a photonic device having output electrodes that generates electron/hole pairs responsive to a light beam interacting with the photonic device;
    an orbital angular momentum (OAM) generation device located to impart an orbital angular momentum to the light beam before the light beam interacts with the photonic device having output electrodes;
    an orbital angular momentum controller for controlling a level of OAM applied to the light beam by the OAM generation device, wherein the orbital angular momentum controller establishes a first predetermined level of electron/hole recombination suppression desired in the photonic device having output electrodes by controlling the OAM generation device to apply a first OAM level to the light beam and establishes a second predetermined level of electron/hole recombination suppression desired in the photonic device having output electrodes by controlling the OAM generation device to apply a second OAM level to the light beam, wherein the second predetermined level of electron/hole recombination suppression is different from the first predetermined level of electron/hole recombination suppression and the second OAM level is different from the first OAM level; and
    wherein electron/hole pair recombination generated from an OAM imparted light beam is less than electron/hole pair recombination of a non-OAM imparted light beam.

8. The apparatus of claim 7, wherein the photonic device generates electrical energy responsive to the OAM imparted light beam interacting within the photonic device having output electrodes.

9. The apparatus of claim 7, wherein the OAM generating circuit comprises a hologram.

10. The apparatus of claim 7, wherein the OAM generating circuit comprise a spatial light modulator.

11. The apparatus of claim 7, wherein the OAM generating circuit comprises a spatial plate.

12. The apparatus of claim 7, wherein the photonic device comprises a biological light harvesting complex.

13. The apparatus of claim 7, wherein the photonic device comprises an organic photovoltaic cell.

14. The apparatus of claim 7, wherein the photonic device comprises an organic light emitting diode.

15. An apparatus for controlling electron/hole recombination, comprising:
    a photonic device having output electrodes that generates electron/hole pairs responsive to a light beam interacting with the photonic device;
    an orbital angular momentum (OAM) generation device located to impart an orbital angular momentum to the light beam before the light beam interacts with the photonic device having output electrodes, the OAM generation device configurable to control a level of OAM applied to the light beam based upon a level of electron/hole recombination suppression desired in the photonic device having output electrodes;

an orbital angular momentum controller for controlling the level of OAM applied to the light beam by the OAM generation device, wherein the orbital angular momentum controller establishes a first predetermined level of electron/hole recombination suppression desired in the photonic device having output electrodes by controlling the OAM generation device to apply a first OAM level to the light beam and establishes a second predetermined level of electron/hole recombination suppression desired in the photonic device having output electrodes by controlling the OAM generation device to apply a second OAM level to the light beam, wherein the second predetermined level of electron/hole recombination suppression is different from the first predetermined level of electron/hole recombination suppression and the second OAM level is different from the first OAM level; and wherein electron/hole pair recombination generated from an OAM imparted light beam is less than electron/hole pair recombination of a non-OAM imparted light beam.

16. The apparatus of claim 7, wherein the OAM generating circuit comprises a hologram.

17. The apparatus of claim 7, wherein the OAM generating circuit comprise a spatial light modulator.

18. The apparatus of claim 7, wherein the OAM generating circuit comprises a spatial plate.

19. The apparatus of claim 7, wherein the photonic device comprises a biological light harvesting complex.

20. The apparatus of claim 7, wherein the photonic device comprises an organic photovoltaic cell.

21. The apparatus of claim 7, wherein the photonic device comprises an organic light emitting diode.

22. A method for improving electron/hole recombination within a photonic device having output electrodes, comprising:

placing an orbital angular momentum (OAM) generating circuit between a light source and the photonic device having output electrodes;

passing a light beam from the light source through the OAM generating circuit prior to the light beam interacting with the photonic device having output electrodes to generate an OAM imparted light beam;

controlling a level of OAM applied to the light beam using the OAM generating circuit;

establishing a first predetermined level of electron/hole recombination suppression desired in the photonic device having output electrodes by applying the light beam having a first OAM level applied thereto from the OAM generating circuit; and establishing a second predetermined level of electron/hole recombination suppression desired in the photonic device having output electrodes by applying the light beam having a second OAM level applied thereto from the OAM generating circuit, wherein the second predetermined level of electron/hole recombination suppression is different from the first predetermined level of electron/hole recombination suppression and the second OAM level is different from the first OAM level; and generating electrical energy responsive to the OAM imparted light beam interacting within the photonic device having output electrodes, wherein the OAM imparted light beam suppresses electron/hole pair recombination within a electrical energy generation process as compared to electrical energy generated using a non-OAM imparted light beam.

23. The method of claim 22 further comprising the step of generating electrical energy responsive to the OAM imparted light beam interacting within the photonic device having output electrodes, wherein the OAM imparted light beam suppresses electron/hole pair recombination within a electrical energy generation process as compared to electrical energy generated using a non-OAM imparted light beam.

24. The method of claim 22, wherein the OAM generating circuit comprises a hologram.

25. The method of claim 22, wherein the OAM generating circuit comprise a spatial light modulator.

26. The method of claim 22, wherein the OAM generating circuit comprises a spatial plate.

* * * * *